US006608522B1

(12) United States Patent
Mumper et al.

(10) Patent No.: US 6,608,522 B1
(45) Date of Patent: Aug. 19, 2003

(54) DC-TO-DC CONVERTER PROVIDING STABLE OPERATION

(75) Inventors: Eric Mumper, Carrollton, TX (US);
Kevin John Lynaugh, Carlsbad, CA (US)

(73) Assignee: Microtune (Texas), L.P., Plano, TX (US)

( * ) Notice: Subject to any disclaimer, the term of this patent is extended or adjusted under 35 U.S.C. 154(b) by 0 days.

(21) Appl. No.: 10/117,320

(22) Filed: Apr. 5, 2002

(51) Int. Cl.$^7$ .................... G05F 1/46; H02M 3/158
(52) U.S. Cl. .................. 330/51; 331/186; 331/175; 327/157
(58) Field of Search ................. 330/51; 331/17, 331/185, 186, 175; 327/157, 156

(56) References Cited

U.S. PATENT DOCUMENTS

| | | | | |
|---|---|---|---|---|
| 4,053,933 A | * | 10/1977 | Collins | 348/733 |
| 4,819,081 A | * | 4/1989 | Volk et al. | 327/12 |
| 4,829,258 A | * | 5/1989 | Volk et al. | 327/156 |
| 4,920,309 A | * | 4/1990 | Szepesi | 323/269 |
| 6,181,203 B1 | * | 1/2001 | Newlin | 330/257 |

OTHER PUBLICATIONS

Philips Data Sheet, "TSA5523M, 1.4 GHz1$^2$C–bus controlled multimedia synthesizer", pp. 1–20, Dec. 17, 1996.

* cited by examiner

*Primary Examiner*—Bao Q. Vu
(74) *Attorney, Agent, or Firm*—Fulbright & Jaworksi LLP

(57) ABSTRACT

The present invention is directed to a system and method which utilizes a fixed base current to control the output voltage instead of a variable base current. In one embodiment, instead of modulating the base current, the converter uses output current to determine the voltage produced at the output. By sinking current out of the DC-to-DC converter, a high output impedance is achieved which, in turn, allows a fairly low modulating current to offer a large change in output voltage. This circuit eliminates at least one of the feedback loops found in existing designs, further increasing stability. As a result of the circuit design, there is achieved a DC-to-DC converter which allows the user to easily define the frequency at which the circuit operates and which is tolerant of component variations.

24 Claims, 3 Drawing Sheets

DC-TO-DC CONVERTER PROVIDING STABLE OPERATION

BACKGROUND OF THE INVENTION

It is well known in the art that DC-to-DC converters are utilized to increase and decrease voltage levels within a system. One way to accomplish such conversion is to use a voltage controlled oscillator as a control element within this converter. This VCO feedback circuit typically has been arranged with other feedback loops forming the DC-to-DC converter.

A varying amount of current provided to the base of a bipolar transistor determines the output voltage generated. Problems with this approach exist with regard to the stability of such a circuit. For example, in some situations, the DC-to-DC circuit is required to run at a low frequency, which interferes with the frequency of the VCO causing the VCO to output spurious signals. Additional problems exist in the fact that DC-to-DC converters are part of an operational amplifier driving a loop filter for a VCO resulting in a closed-loop filter and a closed-loop operational amplifier fixed together. Variations of component tolerances with this arrangement produce stability problems.

For instance, a transistor with a large beta or gain variation modifies the bandwidth of the operational amplifier loop, thereby creating instability. Also, as the number of feedback loops increases instability due to component variations becomes more and more problematic. Accordingly, problems with oscillation frequency level and instability make the existing DC-to-DC converters unsuitable for many applications. Furthermore, the complexity of existing DC-to-DC converter circuits requires a user to compute various component values needed for specific bandwidths, input voltages and output voltages, all of which, once selected, are difficult to change for changing situations.

There exists a desire for a low cost DC-to-DC converter which produces few spurious emissions, provides simple computation of required components and input values, operates at easily controllable frequencies and is operable to produce output to input ratio of voltages, in the order of 6 to 1 or more.

BRIEF SUMMARY OF THE INVENTION

The present invention is directed to a system and method which utilizes a fixed base current to control the output voltage instead of a variable base current. In one embodiment, instead of modulating the base current, the converter uses output current to determine the voltage produced at the output. The high output impedance allows a fairly low modulating current to offer a large change in output voltage. This circuit eliminates at least one of the feedback loops found in existing designs, further increasing stability. As a result of the circuit design, there is achieved a DC-to-DC converter which allows the user to easily define the frequency at which the circuit operates and which is tolerant of component variations.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
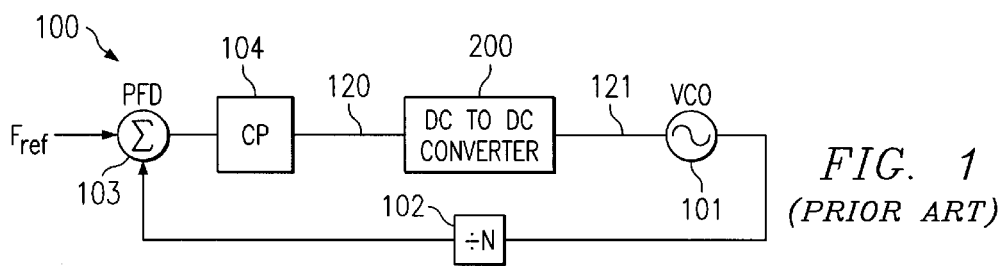
FIG. 1 depicts the usage of a DC-to-DC converter in a typical prior art feedback loop to control output voltage.

FIG. 1 is ablock diagram of system 100 which employs circuit DC-to-DC converter 200 to provide an output voltage which, in turn, controls the frequency of voltage controlled oscillator (VCO) 101. System 100 operates to control the output DC level at node 121 as follows: Assume a voltage between, for example ½ volt and 33 volts applied to node 121, (as will be discussed below, this voltage is the output from the converter where no control voltage is applied) such a voltage would be applied to voltage controlled oscillator 101, which in turn would force an output oscillation from VCO 101 in direct relationship to the applied voltage in the well known fashion. This oscillation, or frequency, would then be divided by N, if desired, as shown by division circuit 102. The output of division circuit 102 is then provided to one input of summer 103. The other input of summer 103 is a frequency reference, which in our example is 4 megahertz. If the 4 megahertz reference frequency matches the frequency input from division circuit 102, then the output voltage of summer 103 would essentially be zero. This output is applied to the input of CP 104, which would then convert the error voltage from summer 103 into an error current which then would be applied to node 120.

In the example the input from division circuit 102 matched the input frequency reference at summer 103 and thus there is no voltage applied to node 120 and the circuit is said to be locked or stable. Let's now assume that the voltage at terminal 121 were to be higher (or lower) than necessary, then that voltage would affect the frequency of the output of VCO 101, which in turn would be divided by 102 and applied to summer 103. Since the frequency reference stays constant at 4 megahertz in our example, then there would be generated an error voltage at the output of summer 103, which in turn would cause an error current to be provided to input node 120 this error current in the manner to be discussed hereinafter, causes the voltage to change at node 121 in a manner to adjust the frequency output of VCO to achieve balance, i.e., a locked condition.

The problems with a system such as this in the past have been to be able to stabilize converter circuit 200 so that the circuit locks and stays locked and is independent of manufacturing tolerances on components, and also which can be partially built on silicon chips for ease of manufacturing critical components. A problem also exists in that the typical voltage used in a silicon chip of this nature is approximately 5 volts, and the high end output necessary at node 121 ranges between ½ volt, which is lower than 5 volts, up to 30 to 33 volts, which is significantly higher than the 5 volts the silicon is designed to withstand. Accordingly, unless one is willing to use silicon which could tolerate 30–35 volts, building the converter on silicon is problematic.

Figure 2:
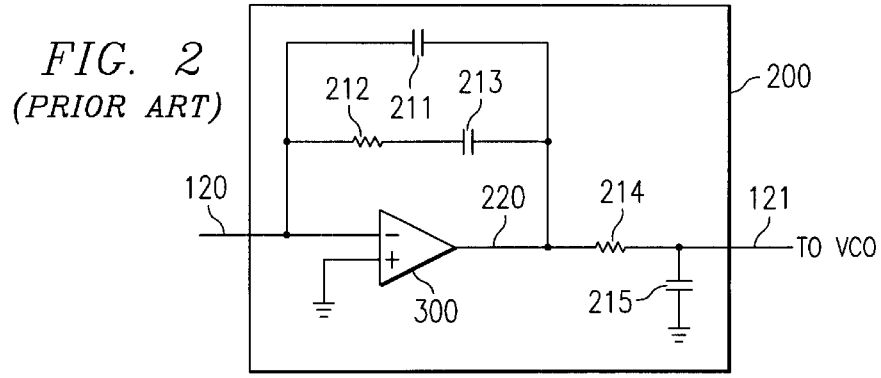
FIG. 2 depicts a typical prior art DC-to-DC converter as used in FIG. 1 in greater detail.

Circuit 200 is shown in more detail in FIG. 2. Circuit 300 is used to control voltage gain and ideally would function independently from the overall performance of system 100. Resistor 214, capacitor 215 is used to provide output node 121 with the desired output voltage of the circuit. Two nested loops, one consisting of capacitor 211 and the other consisting of resistor 212 and capacitor 213 are shown within system 200 for controlling the operation of circuit 300. Elements 211, 212, 213 are the loop filter components of the PLL that control PLL stability.

Figure 3:
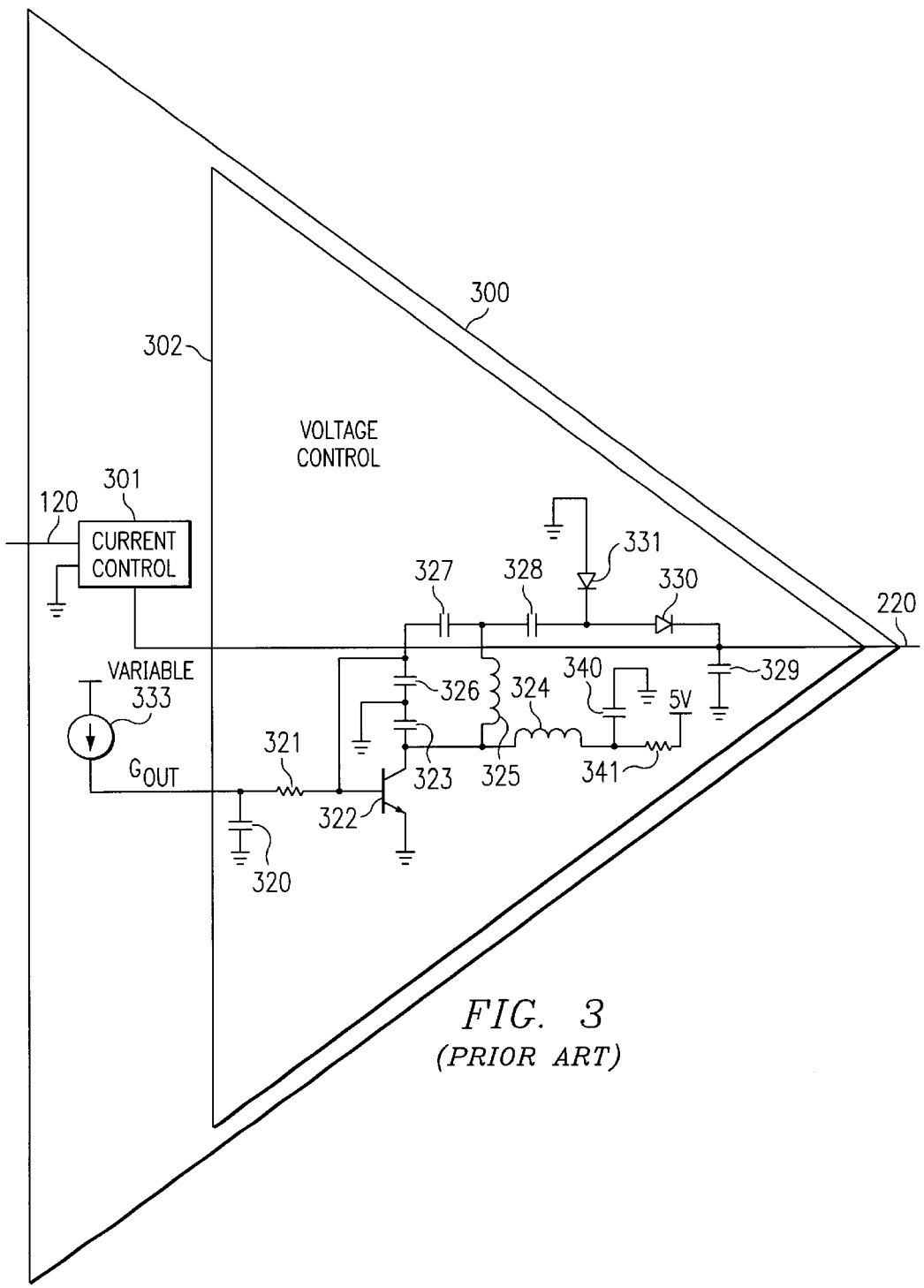
FIG. 3 shows the details of a prior art operational amplifier as used in the system of FIG. 2.

FIG. 3 shows a prior art version of circuit 300 such that the input current to node 120 passes to current control 301 which causes current to be supplied to transistor 332 in voltage control circuit 301. Note that voltage control circuit 302 is a well known circuit and could be, for example, a Philips TSA5523M, as shown on Philips Integrated Circuits Data Sheet dated Dec. 17, 1966 (ICO2), the disclosure of which is hereby incorporated herein by reference. Circuit 302 is designed to provide an output voltage at node 220, dependent upon the current coming into the base of transistor 322. The current to the base of transistor 322 is provided by current (I) generator 333 and is variable dependent upon the desired output voltage and is a function of the closed-loop feedback path formed by the circuit. A higher base current in 322 makes its collector current higher by a factor of β (transistor gain). The higher collector current increases the amplitude of oscillation in the LC oscillator formed by inductor 325 and capacitor 327. This increased amplitude makes voltage 121 higher.

Figure 4:
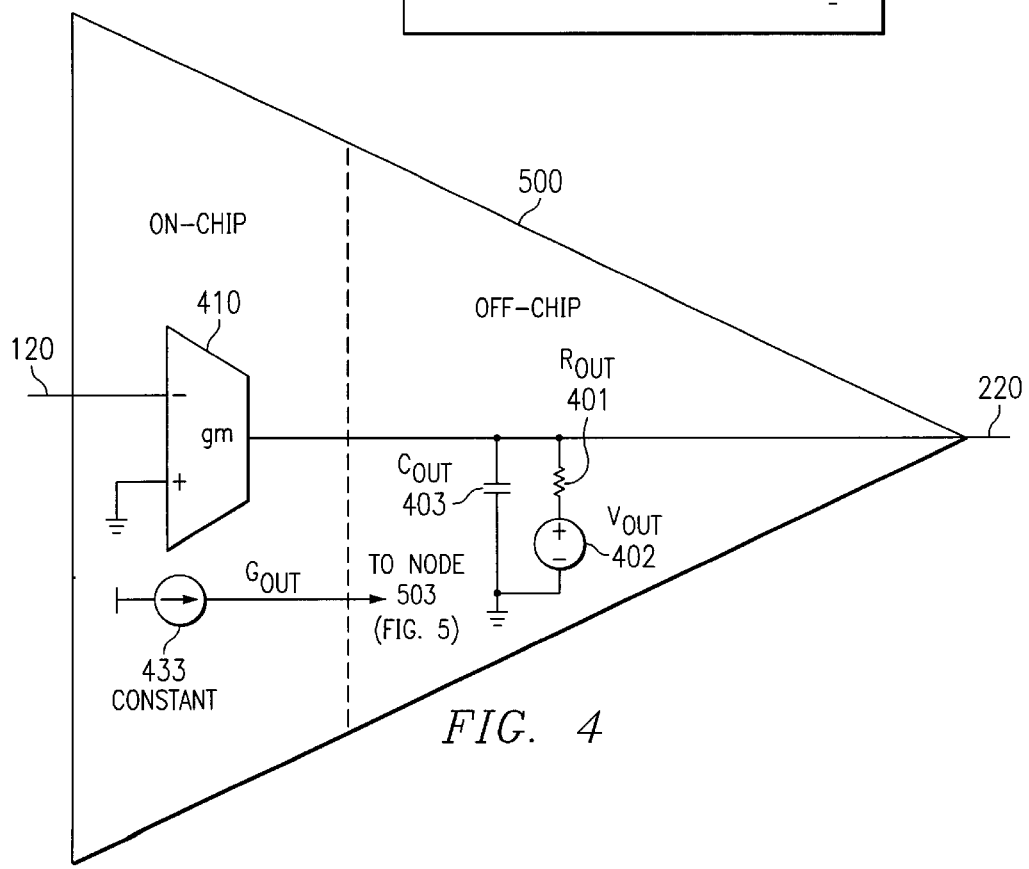
FIG. 4 details an operational amplifier, showing the effective mathematical equivalent circuitry of an exemplary embodiment of the invention.
Figure 5:
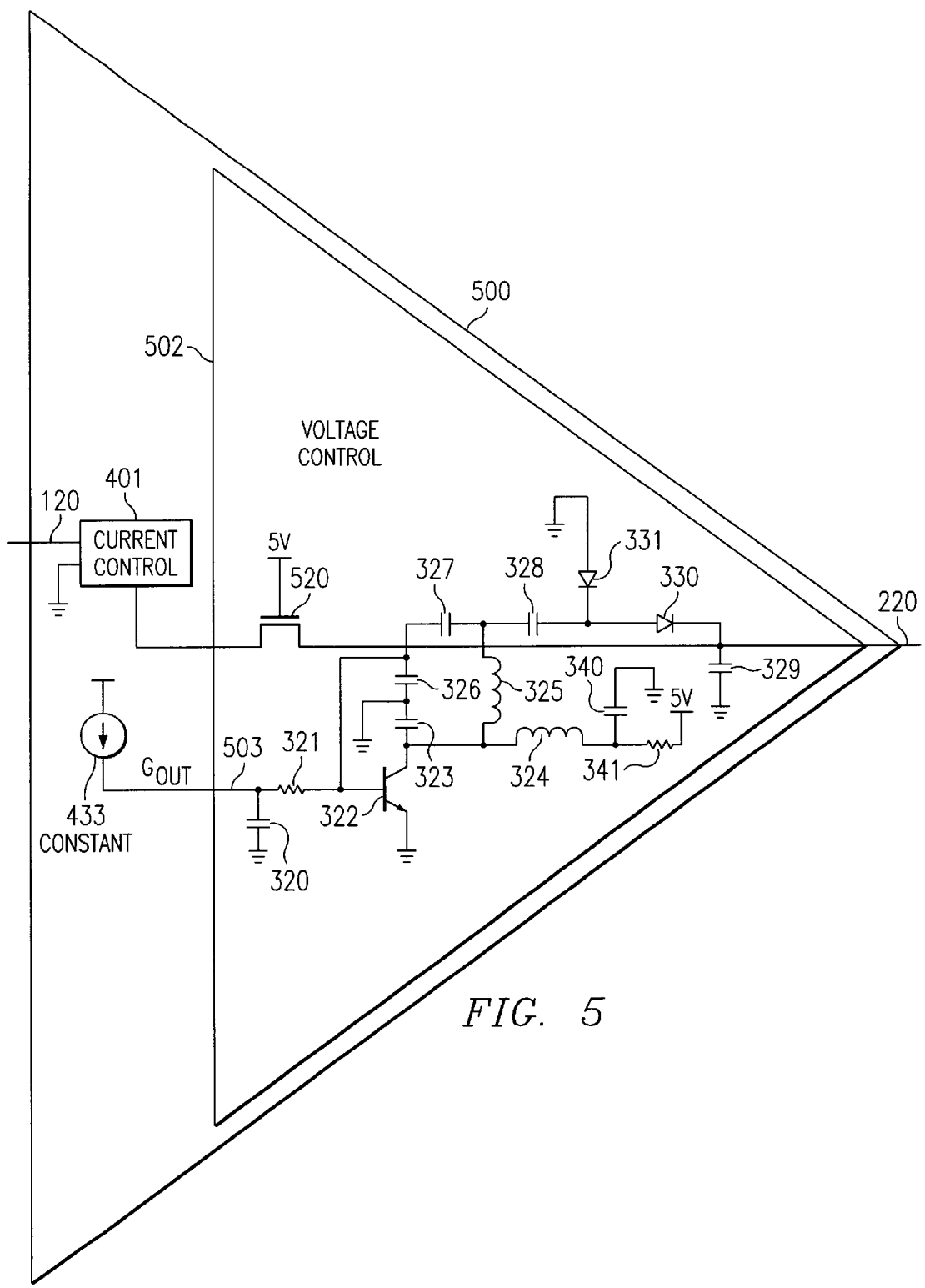
FIG. 5 shows the details of the operational amplifier of the exemplary embodiment of the invention.

FIG. 4 shows DC-to-DC converter circuit 300 modified to form circuit 500 in accordance with the invention. Various portions of circuit 500 are on-chip and certain portions are off-chip as denoted by the dotted line. The on-chip portion is designed around a 5 volt power source, while the off-chip portion handles voltage higher than 5 volts. On-chip transconductance switch 410 accepts an input current at node 120 and generates an output current which is provided to the off-chip portion of the converter composed of components 401 (R-out), 402 (V-out), and 403 (C-out). The circuitry shown in FIG. 4 is the small signal AC equivalent, which is typically used for stability purposes of the full circuit shown in FIG. 5. Note that, as will be discussed, input current 433 to the base of transistor 322 (FIG. 5) is now constant, whereas in the prior art it had been variable. By fixing current 433, the circuit can be reduced for stability calculation purposes. It is this reduction in the equivalent circuit, (by fixing the base current to transistor 322) which then allows transconductance amplifier 410 to control the output voltage of the circuit. We have found that variations in tolerances of transistor 322 was a major cause of the instability problems of the prior art.

Thus, in operation, the current generated at the output of 410 modulates the final output voltage of the circuit as follows: by fixing input current 433 as discussed above to a fixed value such that if nothing else were to change and if transconductance amplifier 410 had no output then the output at node 220 of FIG. 4 would be the maximum. In our example, node 220 would then have 30 volts on it. At this point any change in this voltage would be due to a change in the output of the current coming from transconductance amplifier 410.

If circuit 500 were then to be reintroduced back into FIG. 1 (as circuit 400 (300)) and we assume that with transconductance 410 not providing an output current, the output voltage at node 220 (shown in FIG. 2) would be 30 volts. This voltage, would then cause a frequency at the output of VCO 101, which, inturn, would cause an error current at node 120, which would be fed to the input of transconductance amplifier 410 (FIG. 4) within circuit 500, which, in turn, would provide a current to elements 401, 402, and 403 to reduce the voltage at node 220. This reduced voltage would then be fed to VCO 101 which would change the frequency and the process would be repeated until the output voltage on node 121 caused the frequency output from VCO 101 to match (after being manipulated by circuit 102) the input reference frequency at which time the voltage would lock in place.

Since elements 401, 402, and 403 in FIG. 4 are representations of circuit 502 (FIG. 5), the transconductance output of element 410 then would go to the source of mosfet transistor 520 (as opposed to the prior art (FIG. 3) where it went to node 220). The fixed current from the on-chip current source would go to the base of the transistor 322 via resistor 321 and 503. In all other respects, the equivalent circuit 401, 402, 403 acts as discussed above with respect to circuit 301, FIG. 3.

In a preferred embodiment, a transconductance with a high value of $g_m$ may be implemented, thereby inducing a large gain amount. As it may be desired to have a high gain bandwidth, an appropriate bandwidth may be calculated using $g_m$ divided by the value of effective $C_{out}$ 402. This results in a gain bandwidth independent of $R_{out}$ 401, resulting in a tolerance of different component values. The ability to straightforwardly interchange off-chip components with components that may not be equivalent allows for easy manufacture and maintenance. By operating amplifier 500 in open loop mode, gain is not dependent on specific transistor values and types, allowing interchangeability of transistors, which greatly simplifies design and increases stability. Furthermore, the ability to select a high oscillating frequency in the range of 2.5 MHz (±500 MHz) decreases the total spurious signals of the system. Note that in circuit 500, elements 321, 322, 323, 324, 325, 326, and 327 form an oscillator circuit with its frequency set by the LC combination of elements 325 and 327. The prior art circuit ran in the range of 350 KHz.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A DC-to-DC converter wherein the output ranges from a low voltage to a high voltage and wherein the voltage available for running the circuit is relatively low compared to said high end of said range, said converter comprising:
   a transconductance circuit for accepting an input control signal and for providing an output control signal proportional to accepted ones of said input signals;
   a circuit for accepting said transconductance control signal and converting said signal to an output DC voltage, said output DC voltage being said voltage desired as an output of said DC-to-DC converter; said output DC voltage also being a function of an input current supplied separate from said transconductance control signals; and
   said supplied input current being fixed such that said output DC voltage, in the absence of a control signal from said transconductance circuit, would be said high voltage.

2. The DC-to-DC converter of claim 1 wherein said transconductance circuit is contained on a silicon circuit and wherein said converting circuit is constructed off of said silicon circuit.

3. The DC-to-DC converter of claim 1 wherein said converter is operated in open-loop mode.

4. The DC-to-DC converter of claim 1 wherein said accepting circuit includes an oscillator operable in the range up to 2.5 MHz.

5. The DC-to-DC converter of claim 1 wherein an output of said transconductance circuit is supplied to the source mosfet transistor.

6. The DC-to-DC converter of claim 1 wherein said converter circuit further comprises:
   a feed back loop for controlling PLL stability;
   a VCO operable to provide a frequency output as a function of said output DC voltage;
   a summer for accepting an input reference signal and for accepting said VCO frequency output and for creating an error signal; and
   means for providing said error signal as said input signal to said amplifier.

7. A control circuit for use in a DC to DC voltage converter, said control circuit comprising:
   a first section constructed on a chip for accepting an input control signal and for providing an output control signal proportional to accepted ones of said input signals;
   a second section for accepting said first section control signal and converting said control signal to an output DC voltage, said output DC voltage being the highest voltage desired as an output of said DC-to-DC converter; said output DC voltage also being a function of an input current supplied separate from said first section control signals; and
   said separately supplied input current being fixed such that said output DC voltage, in the absence of a control signal from said first section, would be said highest voltage.

8. The control circuit of claim 7 wherein said second section is off of said chip.

9. The control circuit of claim 7 wherein said second section is operated in open-loop mode.

10. The control circuit of claim 7 wherein said second section includes an oscillator operable in the range up to 2.5 MHz.

11. An amplifier for controlling a specific output voltage; said amplifier comprising:
    a first portion for accepting an input signal and for providing an output current in response to said input signal; and
    a second portion coupled to said first portion for processing said output current signal into a variable voltage signal ranging from ½ volt to 32 volts, wherein said first portion is constructed on a chip having a 5 volt capability and wherein said second portion is constructed off of said chip.

12. The amplifier of claim 11 wherein said first portion provides a fixed current signal for controlling said variable voltage signal.

13. The amplifier of claim 12 wherein said fixed current is set such that said variable voltage signal would be at its maximum desired level in the absence of output current from said first section.

14. The amplifier of claim 11 wherein said second portion bias voltage is 5 volts.

15. The amplifier of claim 11 wherein said amplifier is used in a DC-to-DC converter having a VCO, said VCO controlled by said variable voltage signal.

16. The amplifier of claim 15 wherein said amplifier includes an oscillation circuit having an oscillation frequency outside of a range that would interfere with the frequency of oscillation from said VCO.

17. The amplifier of claim 11 wherein said processing includes a mosfet transistor for accepting said output current.

18. A DC-to-DC converter comprising:
    a summer for accepting a reference frequency at one input;
    a VCO;
    a feed back loop connecting said VCO output frequency to one input of said summer; said summer providing an error signal based on said reference and said VCO output frequency;
    an amplifier; said amplifier comprising:
      a first portion for accepting an input signal and for providing an output current in response to said input signal;
      a second portion coupled to said first portion for processing said output current signal into a variable voltage signal for controlling said VCO, said voltage signal ranging from ½ volt to 32 volts, wherein said first portion is constructed on a chip having a 5 volt capability and wherein said second portion is constructed off of said chip; and
      means for providing said error signal as said input signal to said amplifier.

19. The DC-to-DC converter of claim 18 wherein said first portion provides fixed current signal for controlling said variable voltage signal.

20. The DC-to-DC converter of claim 19 wherein said fixed current is set such that said variable voltage signal would be at its maximum desired level in the absence of output current from said first section.

21. The DC-to-DC converter of claim 18 wherein said second portion bias voltage is 5 volts.

22. The DC-to-DC converter of claim 18 wherein said amplifier is used in a DC-DC converter having a VCO, said VCO controlled by said variable voltage signal.

23. The DC-to-DC converter of claim 22 wherein said amplifier includes an oscillator circuit having an oscillation frequency outside of a range that would interfere with the frequency of oscillation from said VCO.

24. The DC-to-DC converter of claim 18 wherein said processing includes a mosfet transistor for accepting said output current.

* * * * *